United States Patent [19]
Hoppe et al.

[11] Patent Number: 5,631,530
[45] Date of Patent: May 20, 1997

[54] KEY ELEMENT FOR THE CONTROL OF ELECTROMOTORS, ESPECIALLY FOR CRANES AND OTHER HOISTING EQUIPMENT

[75] Inventors: Kurt Hoppe, Breckerfeld; Markus H. Schmalstieg, Hagen; Bernhard Stanski, Recklinghausen; Anton Münzebrock, Dortmund, all of Germany

[73] Assignee: Mannesmann Aktiengesellschaft, Düsseldorf, Germany

[21] Appl. No.: 420,361

[22] Filed: Apr. 11, 1995

[30] Foreign Application Priority Data

Apr. 11, 1994 [DE] Germany ............... 44 12 555.0

[51] Int. Cl.$^6$ ................ G01D 5/12; H02P 7/00; B66C 13/22
[52] U.S. Cl. ............... 318/551; 318/268; 318/549
[58] Field of Search ................ 318/138, 268, 318/551, 549, 139

[56] References Cited

U.S. PATENT DOCUMENTS 3,562,616  2/1971  Elliott .
3,818,292  6/1974  Berman ............... 318/139
4,499,449  2/1985  Shinozaki et al. .
4,578,624  3/1986  Neki et al. .

FOREIGN PATENT DOCUMENTS 423673    4/1991  European Pat. Off. .
2135777   2/1973  Germany .
3934950   4/1991  Germany .

*Primary Examiner*—Bentsu Ro
*Attorney, Agent, or Firm*—Cohen, Pontani, Lieberman, Pavane

[57] ABSTRACT

A key element for the control of electromotors, especially for cranes and other hoisting equipment. The key element includes a key switch pestle, a permanent magnet attached to the key switch pestle and a Hall sensor. The key switch pestle and permanent magnet are moveable both towards and away from the Hall sensor. As the permanent magnet approaches the Hall sensor, a flux density is sensed which triggers the generation of a control signal. In order to create a key element which can be installed in the smallest possible space, in controls and the like, the electronic circuit which includes a permanent magnet positionable toward the Hall sensor is integrated into the key element housing.

8 Claims, 3 Drawing Sheets

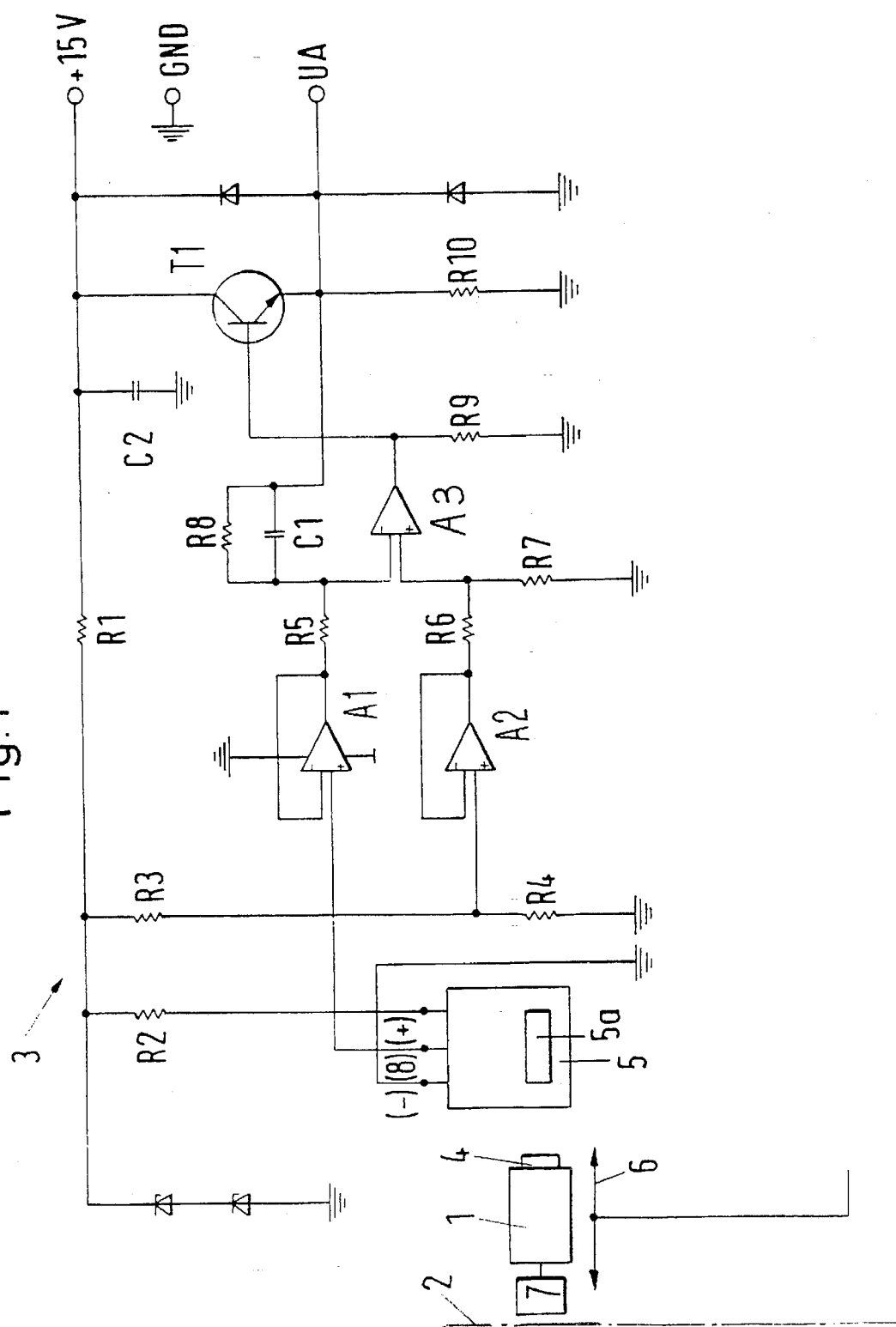

1.

| /mm | Ua  Volt | Ua  Volt | Ua  Volt |
|---|---|---|---|
| 0 | 0,018 | 0,019 | 0,021 |
| 1 | 0,018 | 0,095 | 0,222 |
| 2 | 0,018 | 0,275 | 0,58 |
| 3 | 0,391 | 0,807 | 1,124 |
| 4 | 1,114 | 1,547 | 1,884 |
| 5 | 2,183 | 2,616 | 2,983 |
| 6 | 3,917 | 4,307 | 4,589 |
| 7 | 6,325 | 6,846 | 7,148 |
| 8 | 9,568 | 9,94 | 10,309 |
| 9 | 9,938 | 10,304 | 10,668 |
| 10 | 10,048 | 10,42 | 10,773 |
| R4 | 21,1kOhm | 22k Ohm | 22,6k Ohm |

2.       ( Volt)

| ./mm | 1. | 2. | 3. | 4. | 5. |
|---|---|---|---|---|---|
| 0 | 0,018 | 0,018 | 0,018 | 0,018 | 0,018 |
| 1 | 0,018 | 0,018 | 0,018 | 0,018 | 0,018 |
| 2 | 0,105 | 0,081 | 0,067 | 0,047 | 0,051 |
| 3 | 0,545 | 0,528 | 0,517 | 0,461 | 0,499 |
| 4 | 1,176 | 1,163 | 1,147 | 1,105 | 1,137 |
| 5 | 2,074 | 2,07 | 2,048 | 2,046 | 2,055 |
| 6 | 3,44 | 3,448 | 3,425 | 3,422 | 3,429 |
| 7 | 5,503 | 5,513 | 5,485 | 5,436 | 5,455 |
| 8 | 8,78 | 8,748 | 8,76 | 8,72 | 8,711 |
| 9 | 10,162 | 10,166 | 10,16 | 10,159 | 10,161 |
| 10 | 10,369 | 10,366 | 10,376 | 10,37 | 10,369 | ns
KEY ELEMENT FOR THE CONTROL OF ELECTROMOTORS, ESPECIALLY FOR CRANES AND OTHER HOISTING EQUIPMENT

BACKGROUND OF THE INVENTION

1. Field of the Invention

The present invention relates to a key element for the control of electromotors, especially for cranes and other hoisting equipment. The key element includes a key switch pestle having a permanent magnet attached thereto and being movable towards a sensing device and located within a housing for triggering the generation of a control signal by the sensing device.

2. Description of the Prior Art

An effect known as the Hall effect, after its discoverer, E. Hall, and an associated magnetoresistive effect form the physical basis for Hall sensors and magnetically-controllable resistor sensors. The combination of the Hall effect and the magnetoresistive effect show that moving charge carriers are diverted laterally under the influence of a vertical magnetic field, B, by the Lorentz force. Through the created transverse field, a state of equilibrium is established in the center of the semiconductor chip.

The Hall current $U_H$ is proportional to the magnetic field B and the control current i, and inversely proportional to both the layer thickness d and the charge concentration n of the strip being measured. $R_H$ is termed the Hall constant. When the current paths are observed, they are likewise found to be turned in the close vicinity of the current electrodes by the Hall angle. For small Hall angles (equal to or less than 0.45 degrees), a quadratic dependency of the resistance on the magnetic field B is found. $R_O$ is the resistance without a magnetic field.

Hall sensors are thus active quadrapoles with a current-voltage and Hall-voltage path, while magnetically controllable resistors represent passive magnetic-field-dependent resistances.

All magnetic field sensors that are not used for the direct measurement of magnetic fields utilize the magnetic field as a transmission medium between the physical variable to be measured (position, speed, current, output, etc.) and the sensor. The correct design of the magnetic circuit is thus a prerequisite for full utilization of the sensor characteristics. A distinction is made, depending on shearing, between an open (strongly sheared) and a closed magnetic circuit.

The simplest magnetic circuit consists of a permanent magnet and a sensor. Soft magnetic parts moving past the sensor lead to an induction change, which is detected by the sensor.

In constructing the sensor and selecting the air gap of the sensor/indicator, particular attention must be paid to the sharp drop in magnetic induction which occurs as the distance from the bottom surface of the magnet increases.

For the purpose of determining position, a closed magnetic circuit excited by a permanent magnet is frequently designed as a magnetic fork cabinet. Closed magnet circuits with electrical excitation form the basis for potential-free current and power measurement. The excitation which is generated by the current to be measured, provides an induction, which is measured by a Hall sensor in the air gap. A linear relationship is found between the measurement current and the induction.

In measurement and control engineering, position sensors serve to collect control parameters, such as path, angle and speed, in a non-contact and thus a wear-free manner. Hall sensors are especially suitable for this task.

For the present application of the Hall effect, high requirements are placed on the design of the magnetic circuit. These requirements include high permeability, good linear controllability, low remanence and a small air gap to name just a few.

Hall sensors are semiconductor components, the electrical behavior of which can be influenced by magnetic fields. The basis for this is the aforementioned Hall effect. This effect is seen in band-shaped conductors, through which current flows, which are exposed to a transversal magnetic field. Because of the magnetic field, the electrons flowing through the lamina in the longitudinal direction are diverted to the side. The Hall voltage can then be read off at the side contacts. This Hall voltage depends not only on the size of the current and the magnetic induction, but above all on the speed at which the electrons are flowing through the band-like conductor. In metals, the current flow is produced by many slow electrons, and the Hall voltage is so small as to be scarcely measurable. In contrast, in certain semiconductor materials, in which the current is carried by a few electrons of high speed, the Hall effect is very great.

Components based on this effect furnish an electrical signal when acted on by a magnetic field. If such components are connected to a permanent magnet, then their Hall voltage will change upon the approach of a soft magnetic body which influences the existing magnetic field. Compared to inductive pick-ups, the components based on the Hall effect have an advantage in that their signal voltage is independent of the speed at which the body to be registered, the magnetic body, approaches the sensor. In keeping with the different requirements for the sensor, different design forms may be used.

Key elements for the control of electromotors with multiple speeds should provide a greater or lesser speed depending on the actuating path. This is achieved, for example, in that the key switch pestle sequentially closes multiple contacts on its path, with which contacts assigned speed steps are set. For infinitely variable speed control, the key switch pestle can move a slider on a resistance path, for example. The varying electrical resistance picked up along the pestle path then sets a speed in a path-dependent manner. Both solutions, use of contacts or a slider, are accompanied by wear. This is because the key path is converted into electrical control signals by means of contacting touches. It would be advantageous to have contact-free position measurement for speed control through a key element, because this would not entail wear.

Furthermore, with respect to size, a key element for the control of electromotors should have external dimensions which allow it to fit comfortably into other devices, for example, hand controls and the like, without increasing the size of the device.

SUMMARY OF THE INVENTION

The present invention is based on the object of creating a key element for the control of electromotors using Hall sensors to produce a contact-free position measurement for speed control. The key element can also be arranged in a large number of control devices. This object is attained, according to the present invention, by an electronic circuit, which includes a permanent magnet positionable towards a Hall sensor, which is integrated into the key element housing. As the following description will make clear, such a key element can be of very small structural size. Furthermore, the key element provides excellent results at low circuitry expense and can thus be manufactured economically.

In an embodiment of the present invention, the permanent magnet is attached to the key switch pestle. This also helps to further reduce the structural size.

It is furthermore advantageous that the permanent magnet can be moved toward or away from the Hall sensor axially in a single-pole fashion. When the magnet is far away, the magnetic flux density on the sensing surface of the sensor is almost zero. Under this condition, at an operating voltage of 12 V, the output voltage of the sensor equals 6 V. As the magnetic south pole approaches, the positively directed flux density on the sensor surface increases continuously. The output voltage rises in proportion to the magnetic flux density, until the magnitude of the magnetic field has a value of plus 40 mT and the associated nominal output voltage of 9 is reached. The dependence of the output voltage on the measurement distance is approximately hyperbolic, but can be considered linear for short distances.

It is also advantageous that the permanent magnet is attached to the key switch pestle in an adjustable manner. For alignment on the initial or final value, the resistance R4, which can be seen in FIG. 1 and is described in more detail hereinafter, is needed. It can thereby be shown to what extent the course of the curve changes when the resistance R4 is changed. In the described case, this is done with a resistance decade. As is shown in the charts and graphs accompanying this application, the course has a flat slope in its initial area and just reaches the final value when the resistance becomes less than 22 kOhm. The situation is different when the resistance is set at 22.6 kOhm. At a resistance value of 22.6 kOhm the slope is steep at first and the curve, along its entire course, is almost optimal. The charts and graphs will be described in more detail herein below.

According to further inventive features, the permanent magnet may include or be made of samarium-cobalt and neodymium-iron-boron. These materials are characterized by having a high energy density at low volumes.

In a further feature of the invention, the Hall sensor may include or be made of gallium arsenide, (GaAs).

The various features of novelty which characterize the invention are pointed out with particularity in the claims annexed to and forming a part of the disclosure. For a better understanding of the invention, its operating advantages, and specific objects attained by its use, reference should be had to the drawing and descriptive matter in which there are illustrated and described preferred embodiments of the invention.

BRIEF DESCRIPTION OF THE DRAWINGS

The present invention will be described in more detail with reference to the following drawings:

FIG. 1 is a schematic drawing of an electronic sensing circuit, in accordance with the present invention;

DETAILED DESCRIPTION OF THE PREFERRED EMBODIMENTS

Figures 2A, 2B:
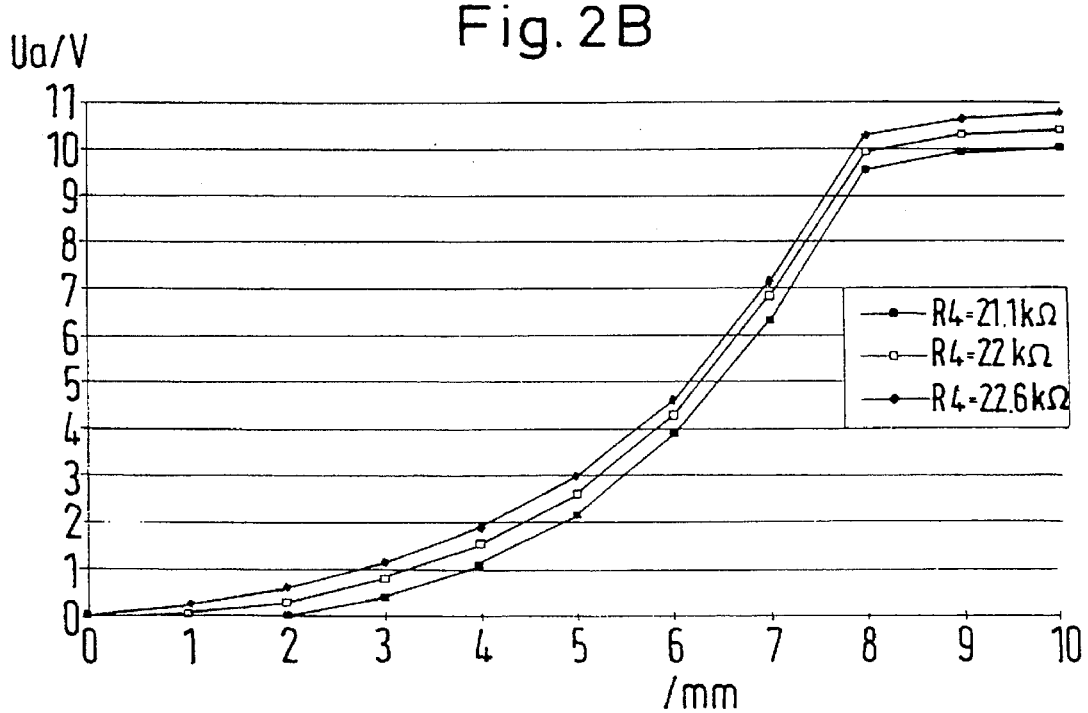
FIG. 2A is a chart containing output voltages obtained from the circuit of FIG. 1 for varied control resistances.
FIG. 2B is a graphical representation of the output voltages from the chart of FIG. 2A.

FIG. 1 shows a circuit which is able to sense position measurements in a contact-free manner using a Hall sensor. A key switch pestle 1 is movably positioned within a housing 2 which is fragmentarily and diagrammatically depicted by a dashed line. Attached to the key switch pestle 1 is a permanent magnet 4. The permanent magnet 4 is adjustably positioned on the key switch pestle 1. This allows the angle at which the permanent magnet 4 and thus the angle at which the magnetic flux approaches the Hall sensor 5 to be adjusted. As the output voltage of the Hall sensor 5 is dependant on the sensed magnetic flux, by adjusting or varying the angle of the permanent magnet in with relation to the Hall sensor 5' the magnitude of the magnetic flux sensed by the Hall sensor 5% will also be varied. Thus an optimum magnetic flux for the desired application can be obtained by adjusting the angle of the permanent magnet 4. A Hall sensor 5 including an active area 5a is attached to an electronic circuit 3 which is also positioned within the housing in alignment with the key switch pestle 1. The permanent magnet 4 is attached to the key switch pestle so as to face the Hall sensor 5. The key switch pestle 1 is positioned to move back and forth with respect to the active area 5a in the direction shown by the arrow labelled with the numeral 6. Return movement of the key switch pestle 1 may be carried out by a reset spring 7. As the key switch pestle 1 moves toward the active area 5a, the permanent magnet 4 is also caused to move closer to the active area 5a. This movement increases the flux density sensed by the active area 5a which results in an increased voltage. The flux density sensed and thus the output voltage are dependent upon the proximity of the permanent magnet 4 to the active area 5a.

FIG. 1 further shows the Hall sensor 5 coupled to the electric circuit 3. This circuit 3 is a preferred circuit for use with an electromotor, as intended by this application, to obtain results desired. The Hall sensor 5 is positioned in proximity to the permanent magnet 4 on the key switch pestle 1 and includes a positive input terminal connected through resistors R1 and R2 to a voltage source to thereby provide the sensor 5 with the operating voltage. The sensor also has a negative input terminal connected to ground. As previously stated, the Hall sensor 5 has an operating voltage of 12 volts and an output voltage of 6 volts when receiving this operating voltage across its input terminals. When the permanent magnet 4 approaches the Hall sensor 5 the output voltage rises proportionately with the magnetic flux density supplied by the magnet 4. The output terminal is connected to the positive terminal of an operational amplifier A1. This amplifier A1 has its negative terminal coupled to receive feedback from the output terminal. The operational amplifier A1 as shown here acts as a buffer since the input to the negative terminal equals the output and thus provides no gain. This type of operational amplifier is called a unity gain amplifier. The output of this amplifier A1 is connected through a resistor R5 to both an RC circuit including resistor R8 and capacitor C1 connected in parallel and to the negative input of an amplifier A3. The RC circuit is also coupled at its other end to the output UA of the circuit. The voltage source is also connected to the positive terminal of a unity gain amplifier A2. The positive terminal of the amplifier A2 is connected to the voltage source at a position between a resistor R3 and a resistor R4. The resistor R4 is also connected to ground. As will be described in more detail hereinafter, the input voltage at the positive terminal and thus the output voltage of amplifier A2 can be changed by varying the resistance value of resistor R4. The output of this amplifier A2 is connected, through a resistor R6, to the positive terminal of amplifier A3. The output of amplifier A3 is connected to the base of a transistor T1. The output voltage UA of the circuit 3 is taken from the emitter of transistor T1. The collector of the transistor T1 is connected to the voltage source. When the output of amplifier A3 is able to turn on transmitter T1, as the permanent magnet 4 approaches the Hall sensor 5 thus increasing its output voltage and the output voltage of amplifier A1, an output control voltage is produced at the emitter of the transistor T1. The magnitude of this output is thus dependent on the proximity of the permanent magnet 4 to the Hall sensor 5. As the permanent magnet 4 approaches the Hall sensor 5, the flux density increases and thus the output voltage of the Hall sensor 5 likewise increases. When the permanent magnet 4 moves away from the Hall sensor 5 the magnitude of the flux density decreases thus causing the transistor T1 to turn off.

FIG. 2A shows the extent to which the course of the curve changes based upon a change in the resistance R4. These measurements were taken as the permanent magnet 4 moved towards the Hall sensor 5. This change is carried out with a resistance decade which is not shown in the drawings. FIG. 2A and FIG. 2B then show that the curve has a flat slope in the initial area and that the final value of 10 volts is reached when the resistance becomes slightly less than 22 kOhm. The situation is otherwise when the resistance is set at 22.6 kOhm. Here the slope is steeper at first and the curve, along the entire course, is optimal.

Figures 3A, 3B:
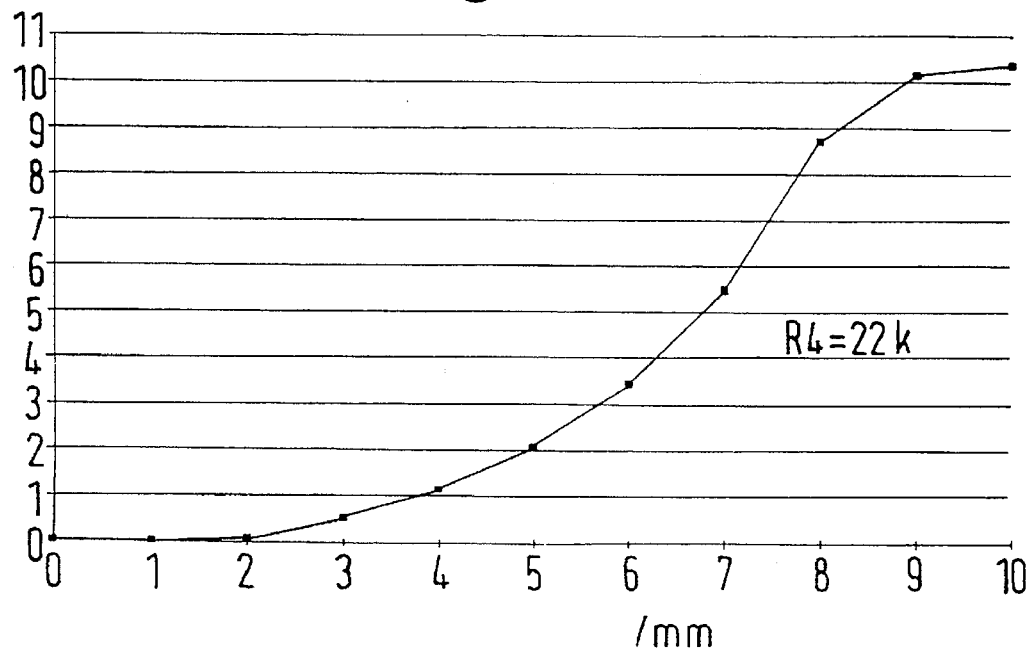
FIG. 3A is a chart containing a series of output voltages obtained from the circuit of FIG. 1 using a constant control resistance.
FIG. 3B is a graphical representation of the average of the output voltages for each measurement from the chart of FIG. 3A.

According to the measurement values in FIG. 3A, the second measurement series, the resistance R4 was permanently soldered in with the value 22 kOhm, and after this, the switch could again be clamped into the measurement device. Subsequently, the key switch pestle 1 was pressed five times at regular intervals; from these results, a median value was calculated and is depicted in the curve line shown in FIG. 3B.

Based on the measurements from the electronic circuit 3 with the Hall sensor 5, the desired success was achieved. An initial allowance after an exponential curve course, i.e., a good means of regulating the lower speeds of an electromotor, was fulfilled. In addition, aligning the resistance R4 and at the same time changing the curve course does not pose a problem. The characteristic curve suitable in a practical case can be determined in advance. If, for example, the slope in the initial area is important, or if it is important to reach a precise final value of 10 volts, then the curve course can be changed accordingly. The effects of the different resistance designs for R4 on the characteristic course of the output voltage are shown by the first measurement series and depicted in FIGS. 2A and 2B. An especially advantageous curve results when the resistance R4=22.6 kOhm, because this curve has the most advantageous slope for the intended use described herein.

Circuitry expenditure for the key switch pestle 1 with the Hall sensor 5 is relatively low and economical, whereby the somewhat higher costs for the Hall sensor 5 and the permanent magnet 4 are not significant.

It is clear that the electronic circuit with the Hall sensor 5 and the positionable permanent magnet 4 can easily be accommodated in even the smallest housing.

The invention is not limited by the embodiments described above which are presented as examples only but can be modified in various ways within the scope of protection defined by the appended patent claims.

We claim:
1. A hand-held key element for controlling an electromotor, the key element comprising:
   a housing;
   a key switch pestle positioned within the housing so as to be axially movable;
   a Hall sensor including an active area positioned within the housing in alignment with the key switch pestle and connected to the electromotor for generating a control signal for controlling the electromotor;
   a permanent magnet attached to an axial end of the key switch pestle so as to face the Hall sensor and movable with the key switch pestle both towards and away from the Hall sensor with respect to the active area in an axially single pole manner, whereby, as the magnet moves towards the Hall sensor, an increased flux density is sensed by the Hall sensor thereby increasing the voltage of said control signal supplied to said electromotor.

2. A key element as claimed in claim 1, further comprising an electric circuit coupled between the Hall sensor and the electromotor for receiving the control signal from the Hall sensor and for providing an output voltage to the electromotor, the magnitude of the output voltage being dependent on the magnitude of the control signal.

3. The key element as claimed in claim 2, wherein the electric circuit comprises a resistance decade for changing a slope of the output signal as the permanent magnet approaches the Hall sensor.

4. The key element as claimed in claim 1, further comprising a reset spring attached to the key switch pestle for controlling movement of both the key switch pestle and permanent magnet in a direction away from the Hall sensor.

5. The key element as claimed in claim 1, wherein the Hall sensor includes an active area for measuring the flux density associated with the distance of the permanent magnet from the Hall sensor.

6. The key element as claimed in claim 1 wherein the permanent magnet comprises one of samarium-cobalt and neodymium-iron-boron.

7. The key element as claimed in claim 1 wherein the Hall sensor is comprised of gallium arsenide.

8. A key element for controlling an electromotor, the key element comprising:
   a housing;
   a key switch pestle movably positioned within the housing;
   a Hall sensor positioned within the housing and connected to the electromotor for generating a control signal for controlling the electromotor;
   a permanent magnet attached to the key switch pestle and movably with the key switch pestle both towards and away from the Hall sensor, whereby, as the magnet moves towards the Hall sensor, an increased flux density is sensed by the Hall sensor thereby increasing the voltage of said control signals supplied to said electromotor; and
   an electric control circuit coupled between the Hall sensor and the electromotor for receiving the control signal from the Hall sensor and for providing an output voltage to the electromotor, the magnitude of the output voltage being dependent on the magnitude of the control signal, the electric circuit including a resistance decade for changing a slope of the output signal as the permanent magnet approaches the Hall sensor.

* * * * *